(12) United States Patent
Ramanan

(10) Patent No.: US 12,087,365 B2
(45) Date of Patent: Sep. 10, 2024

(54) MODULATION OF SOURCE VOLTAGE IN NAND-FLASH ARRAY READ

(71) Applicant: Intel Corporation, Santa Clara, CA (US)

(72) Inventor: Narayanan Ramanan, San Jose, CA (US)

(73) Assignee: Intel NDTM US LLC, Santa Clara, CA (US)

( * ) Notice: Subject to any disclaimer, the term of this patent is extended or adjusted under 35 U.S.C. 154(b) by 639 days.

(21) Appl. No.: 17/202,137

(22) Filed: Mar. 15, 2021

(65) Prior Publication Data

US 2022/0293194 A1 Sep. 15, 2022

(51) Int. Cl.
| | | |
|---|---|---|
| *G11C 16/26* | (2006.01) | |
| *G11C 16/04* | (2006.01) | |
| *G11C 16/08* | (2006.01) | |
| *G11C 16/30* | (2006.01) | |
| *G11C 16/34* | (2006.01) | |

(52) U.S. Cl.
CPC .......... *G11C 16/26* (2013.01); *G11C 16/0483* (2013.01); *G11C 16/08* (2013.01); *G11C 16/30* (2013.01); *G11C 16/3427* (2013.01)

(58) Field of Classification Search
CPC ..... G11C 16/26; G11C 16/0483; G11C 16/08; G11C 16/30
See application file for complete search history.

(56) References Cited

U.S. PATENT DOCUMENTS

| | | | |
|---|---|---|---|
| 7,518,932 B2 * | 4/2009 | Barkley | G11C 16/349 |
| | | | 365/185.29 |
| 9,336,892 B1 | 5/2016 | Chen et al. | |
| 9,412,463 B1 | 8/2016 | Chen et al. | |
| 10,276,248 B1 | 4/2019 | Lu et al. | |

OTHER PUBLICATIONS

Extended European Search Report for Patent Application No. 22152895.3, Mailed Aug. 3, 2022, 7 pages.

* cited by examiner

*Primary Examiner* — Jae U Yu
(74) *Attorney, Agent, or Firm* — Akona IP PC

(57) ABSTRACT

Modulation of the source voltage in a NAND-flash array read waveform can enable improved read-disturb mitigation. For example, increasing the source line voltage to a voltage with a magnitude greater than the non-idle source voltage during the read operation when the array is idle (e.g., not during sensing) enables a reduction in read disturb without the complexity arising from the consideration of multiple read types. Additional improvement in FN disturb may also be obtained on the sub-blocks in the selected SGS by increasing the source line voltage during the selected word-line ramp when the array is idle.

20 Claims, 9 Drawing Sheets

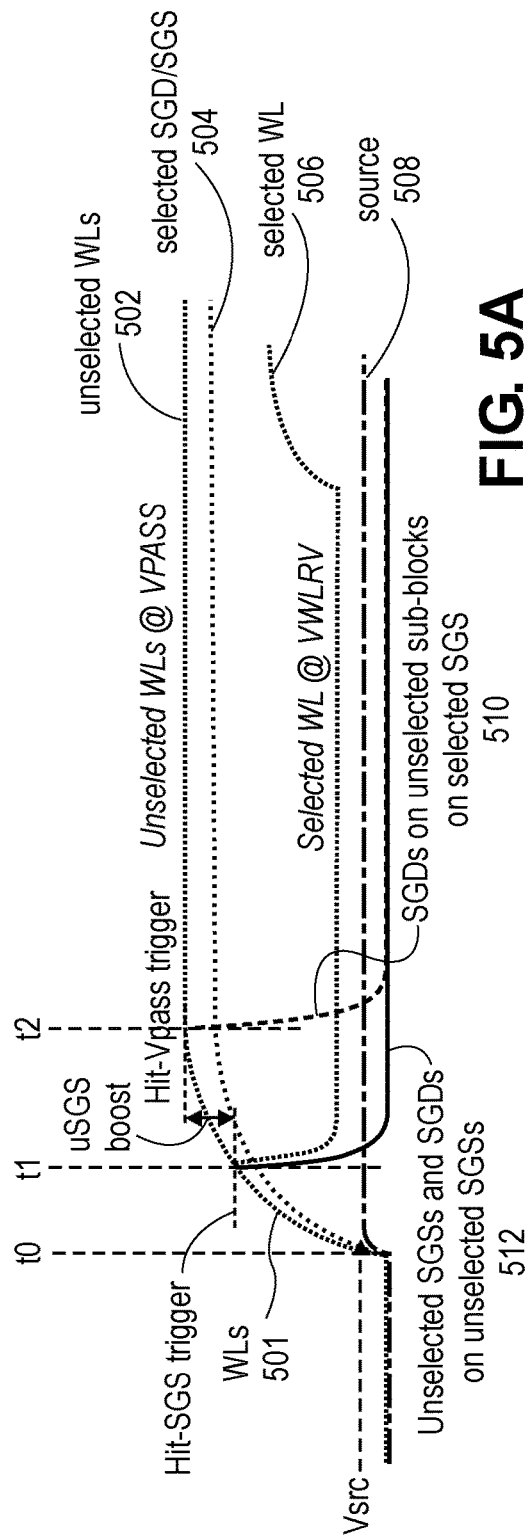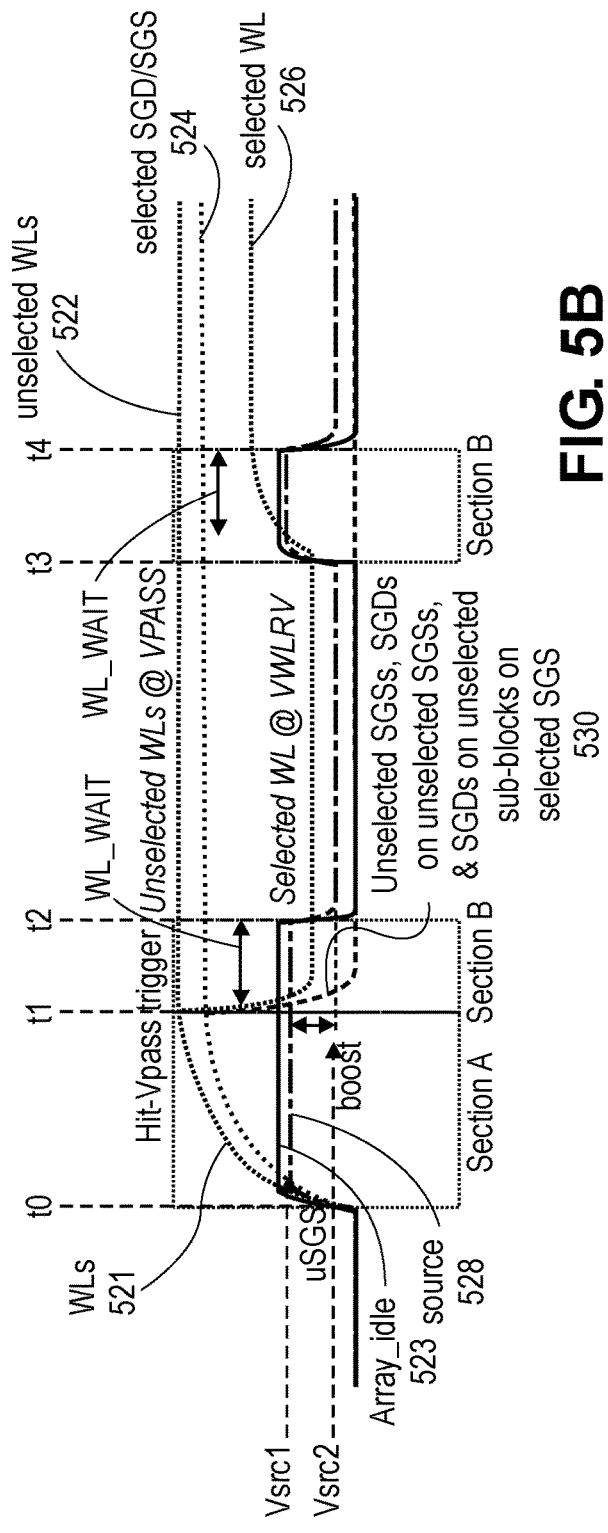

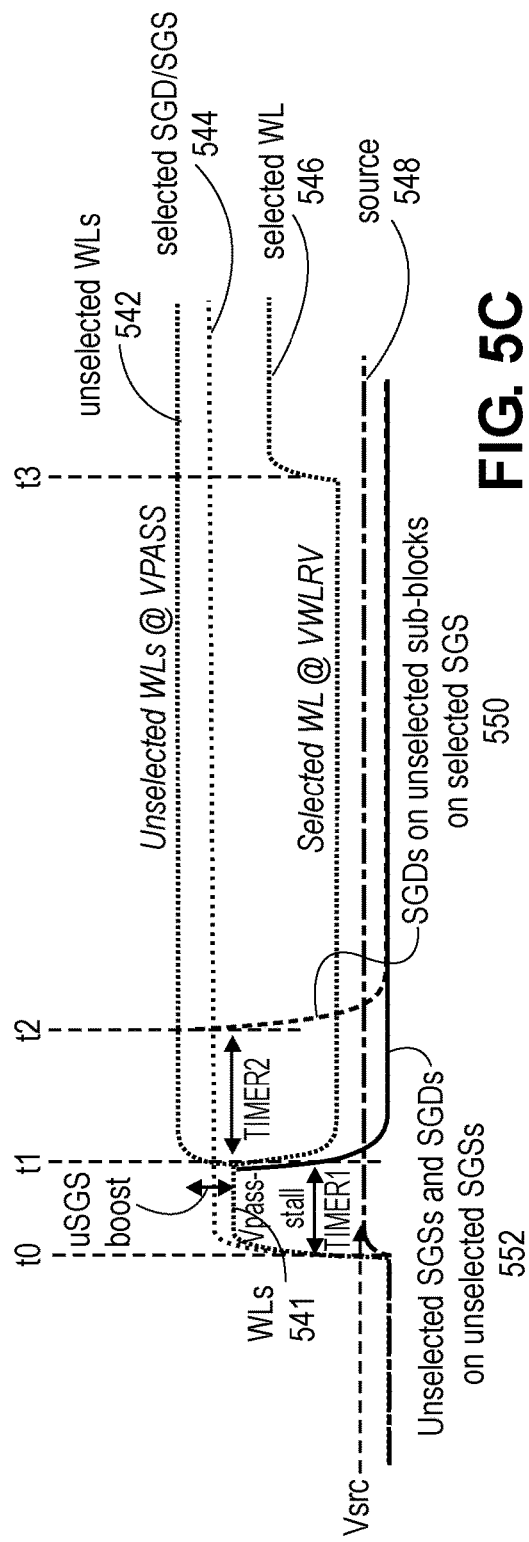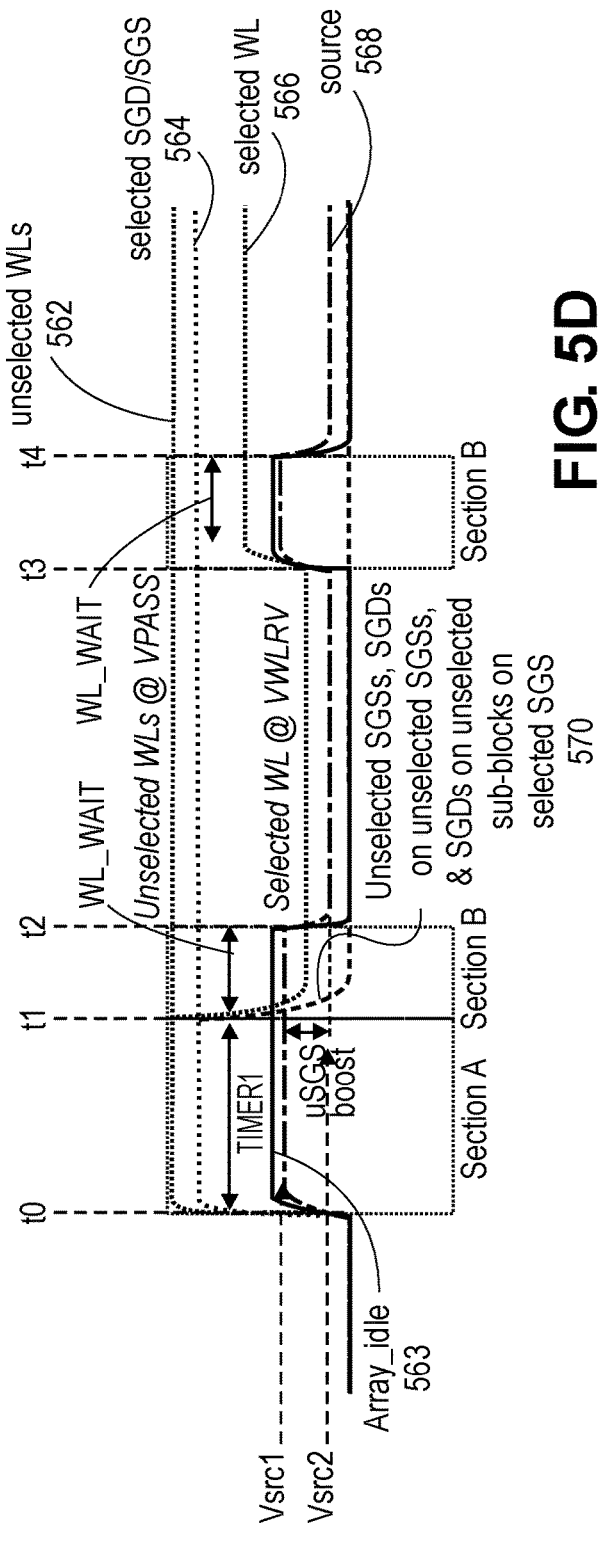

MODULATION OF SOURCE VOLTAGE IN NAND-FLASH ARRAY READ

FIELD

The descriptions are generally related to non-volatile storage media such as NAND flash memory, and specifically to read-disturb mitigation in NAND flash memory.

BACKGROUND

Flash storage, such as NAND flash memory, is a nonvolatile storage medium. Nonvolatile storage refers to storage having a state that is determinate even if power is interrupted to the device. Three dimensional (3D) NAND flash memory refers to NAND flash memory in which a NAND string may be built vertically so that field effect transistors (FETs) of the string are stacked on top of one another. 3D NAND and other 3D architectures are attractive in part due to the significantly higher bit densities that can be achieved relative to two dimensional (2D) architectures. Thus, flash storage is increasingly being used across mobile, client, and enterprise segments. In addition to the high bit density, other metrics, such as low error rate, are also desirable in storage technologies.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" or "examples" are to be understood as describing a particular feature, structure, and/or characteristic included in at least one implementation of the invention. Thus, phrases such as "in one embodiment" or "in one example" appearing herein describe various embodiments and implementations of the invention, and do not necessarily all refer to the same embodiment. However, they are also not necessarily mutually exclusive.

FIGS. 5A-5D illustrate examples of read waveforms.

Descriptions of certain details and implementations follow, including a description of the figures, which may depict some or all of the embodiments described below, as well as discussing other potential embodiments or implementations of the inventive concepts presented herein.

DETAILED DESCRIPTION

Modulation of the source voltage in a NAND-flash array read waveform can enable improved read-disturb mitigation. Read disturb refers to the unintentional change of the state of cells due to read operations. Typically, read disturb occurs in the neighboring cells (victims) of memory cells being read (aggressors). For example, if a block in a 3D NAND array is subject to a large number of read operations, read disturb may occur in neighboring cells, especially cells that have a low threshold voltage (Vt). Read disturb can have various causes. One type of read disturb is referred to as Fowler-Nordheim (FN) or trap-assisted tunneling disturb, which occurs due to the application of high turn-on bias (overdrive) on the unselected wordlines during the read. Another type of read disturb is hot-carrier injection (HCI), which can occur in an unselected sub-block from an aggressor high Vt cell on the selected wordline to a victim low Vt neighbor cell. Hot-carrier injection disturb typically occurs after an array has been idle for a period of time and where the array has equilibrated.

One technique for reducing FN read disturb is to partially boost the subblocks (SBs) on the unselected select-gate-source (uSGS) during the entire duration of the read. However, excess boosting of the SBs can worsen HCI disturb. Therefore, read disturb mitigation in 3D NAND devices typically involves complex designs to balance FN and HCI disturb mitigation. Additional complexity may arise due to the consideration of multiple types of read waveforms supported by the device.

In contrast, increasing the source line voltage during the read operation when the array is idle (e.g., not during sensing) enables a reduction in read disturb without the complexity arising from the consideration of multiple read types. Additional improvement in FN disturb can also be obtained on the sub-blocks in the selected SGS by reducing overdrive in some parts of the read waveform, as explained in more detail below.

Figure 1:
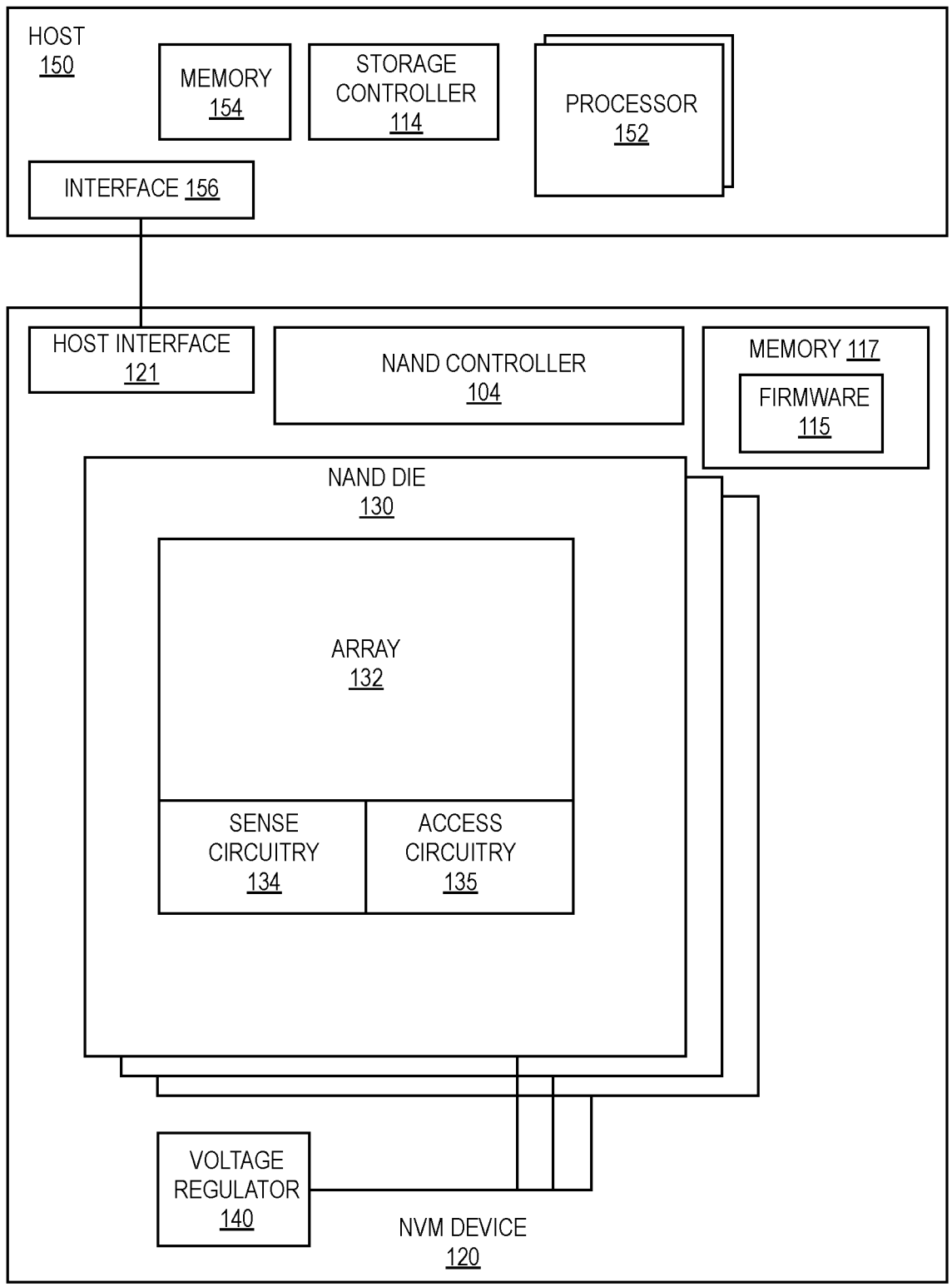
FIG. 1 is a block diagram of an example system that includes a NAND device.

FIG. 1 is a block diagram of an example system that includes a NAND device. The system 100 is an example of a system that may implement read disturb mitigation techniques described herein.

The system 100 includes a host 150 and non-volatile storage or non-volatile memory (NVM) device 120. The NVM device 120 may be a solid state drive (SSD) or other non-volatile memory device or drive. The host 150 and the NVM device 120 can be an example of a system that exists within the confines of a computer's package (e.g., within a laptop/notebook, server, or other computer). In other examples, the NVM 120 may be accessed via a larger network such as a local area network (e.g., an Ethernet network), or a wide area network (such as a wireless cellular network, the Internet, etc.). Such examples may be in compliance with a standard such as NVMe-oF (non-volatile memory express over fabrics). The host 150 includes one or more processors 152, memory 154, a storage controller 114, and other components that are omitted from the drawing for clarity.

The NVM device 120 includes one or more memory arrays 132 for storing data. The arrays 132 can be a memory or storage medium that can store one or more bits in memory cells. In one example, the arrays include strings of memory cells such as the NAND string illustrated in FIG. 2, discussed below. In one example, the NVM device 120 includes one or more non-volatile memory dies, each divided into multiple planes or groups. NAND flash memory is typically block-addressable. Typical NAND dies have multiple planes per die. A plane includes multiple memory cells which may be grouped into blocks. A block is typically the smallest erasable entity in a NAND flash die. In one example, a block includes a number of cells that are coupled to the same bitline. A block includes one or multiple pages of cells. The size of the page can vary depending on implementation. In one example, a page has a size of 16 kB. Page sizes of less or more than 16 kB are also possible (e.g., 512 B, 2 kB, 4 kB, etc.). In one example, the array 132 can include memory devices that use multi-threshold level NAND flash memory. The array 132 can include single-level cell (SLC) NAND storage devices, multi-level cell (MLC) NAND storage devices, triple-level cell (TLC) NAND storage devices, quad-level cell (QLC) storage devices, penta-level cell (PLC), and/or some other NAND.

The NVM device 120 communicates with the host system 150 using respective interfaces 121 and 156. In one example, the interface 156 is a part of a peripheral control hub (PCH). In the example illustrated in FIG. 1, the host includes a controller 114 that is coupled with the NVM device 120 via the interface 156 to communicate with and control the NVM device 120. In the illustrated example, the NVM device 120 includes a controller 104 that is coupled with a computing platform such as the host 150 via the interface 121. In one example, the controller 104 is an ASIC (application specific integrated circuit). In one example, the interfaces are compliant with a standard such as PCI Express (PCIe), serial advanced technology attachment (ATA), a parallel ATA, universal serial bus (USB), and/or other interface protocol. The controller 104 can communicate with elements of the computing platform to read data from the NAND dies 130 or write data to the NAND dies 130. Although in this disclosure, the term "host" is referring to a system with a processor (or other device sending requests to access data stored in a non-volatile memory) and an interface for communicating with the NAND (e.g., the host 150), some implementations may refer to the controller 104 as a "host" relative to the NAND dies 130.

The controller 104 can be configured to receive requests from the host 150 and generate and perform commands concerning the access of the arrays 132 (e.g., to read data, write, or erase data). Other commands may include, for example, commands to read status, commands to change configuration settings, a reset command, etc. The controller includes control logic that can be implemented with hardware (e.g., circuitry), software, firmware, or a combination of hardware, software and firmware. Examples of logic circuitry include dedicated hardwired logic circuitry (including, e.g., one or more state machine logic circuits), programmable logic circuitry (e.g., field programmable gate array (FPGA), and a programmable logic array (PLA). In one example, logic circuitry is designed to execute some form of program code such as SSD firmware (e.g., an embedded processor, embedded controller, etc.).

The NVM device 120 may include a memory 117 coupled with the controller 104 which can be used to cache data from the non-volatile media and store firmware 115 executed by the controller 104. In one example, the memory 117 is volatile memory. Volatile memory is memory whose state (and therefore the data stored in it) is indeterminate if power is interrupted to the device. Dynamic volatile memory requires refreshing the data stored in the device to maintain state. One example of dynamic volatile memory incudes DRAM (Dynamic Random Access Memory), or some variant such as Synchronous DRAM (SDRAM). A memory subsystem as described herein may be compatible with a number of memory technologies, such as DDR3 (Double Data Rate version 3, original release by JEDEC (Joint Electronic Device Engineering Council) on Jun. 27, 2007). DDR4 (DDR version 4, originally published in September 2012 by JEDEC), DDR5 (DDR version 5, originally published in July 2020), LPDDR3 (Low Power DDR version 3, JESD209-3B, August 2013 by JEDEC), LPDDR4 (LPDDR version 4, JESD209-4, originally published by JEDEC in August 2014), LPDDR5 (LPDDR version 5, JESD209-5A, originally published by JEDEC in January 2020), WIO2 (Wide Input/Output version 2, JESD229-2 originally published by JEDEC in August 2014), HBM (High Bandwidth Memory, JESD235, originally published by JEDEC in October 2013), HBM2 (HBM version 2, JESD235C, originally published by JEDEC in January 2020), or HBM3 (HBM version 3 currently in discussion by JEDEC), or others or combinations of memory technologies, and technologies based on derivatives or extensions of such specifications. The JEDEC standards are available at www.jedec.org.

The controller 104 is coupled with the NAND dies 130 to control or command circuitry on the dies to cause operations to occur (e.g., read, program, erase, suspend, resume, and other operations). Communication between the NAND dies 130 and the controller 104 may include the writing to and/or reading from specific registers. Such registers may reside in the controller 104, on the NAND dies 130, or external to the controller 104 and the NAND dies 102. Registers or memory within the dies 130 may be reachable by the controller 104 by, e.g., an internal interface between the controller 104 and NAND dies 130 (e.g., an Open NAND Flash Interface (ONFI) interface, a proprietary interface, or other interface) to communicatively couple the controller 104 and the arrays 132. Input/output (I/O) pins and signal lines communicatively couple the controller 104 with the NAND dies 130 to enable the transmission of read and write data between the controller 104 and the NAND dies 130. The I/O pins may also be used to transmit other data, such as status information of the dies or planes of the NAND dies 130. The NAND dies can also include other pins such as command pins (e.g., command latch enable (CLE), address latch enable (ALE), chip enable (CE #), read enable (RE #), and write enable (WE #)), and power and ground pins (e.g., Vcc, Vss, etc.). The voltage regulator 140 represents circuitry to provide one or more voltages to the access circuitry 135, sense circuitry 134, and/or array 132.

The NAND die 130 includes access circuitry 135 to control access to the array 132. For example, the access circuitry 135 is to generate or apply voltages to the array 132 to perform access operations (e.g., read operations, program operations, etc.) based on commands received from the controller 104. The access circuitry on the NAND die 130 is coupled to word lines of array 132 to select one of the word lines, apply read voltages, apply program voltages combined with bit line potential levels, apply verify voltages, or apply erase voltages. The sense circuitry 134 and access circuitry 135 is coupled to bit lines of array 132 to read data stored in the memory cells, determine a state of the memory cells during a program operation, and control potential levels of the bit lines to promote or inhibit programming and erasing.

Thus, the access circuitry 135 includes circuity to generate a "read waveform," which includes voltages to apply to the array at particular times and for particular durations for performing a read operation. Similarly, the access circuitry 135 includes circuitry to generate a "program waveform," including voltages to apply to the array at particular times and for particular durations for performing a program operation. Techniques for reducing read disturb can be implemented with the read waveform, as is described in more detail below.

Figure 2:
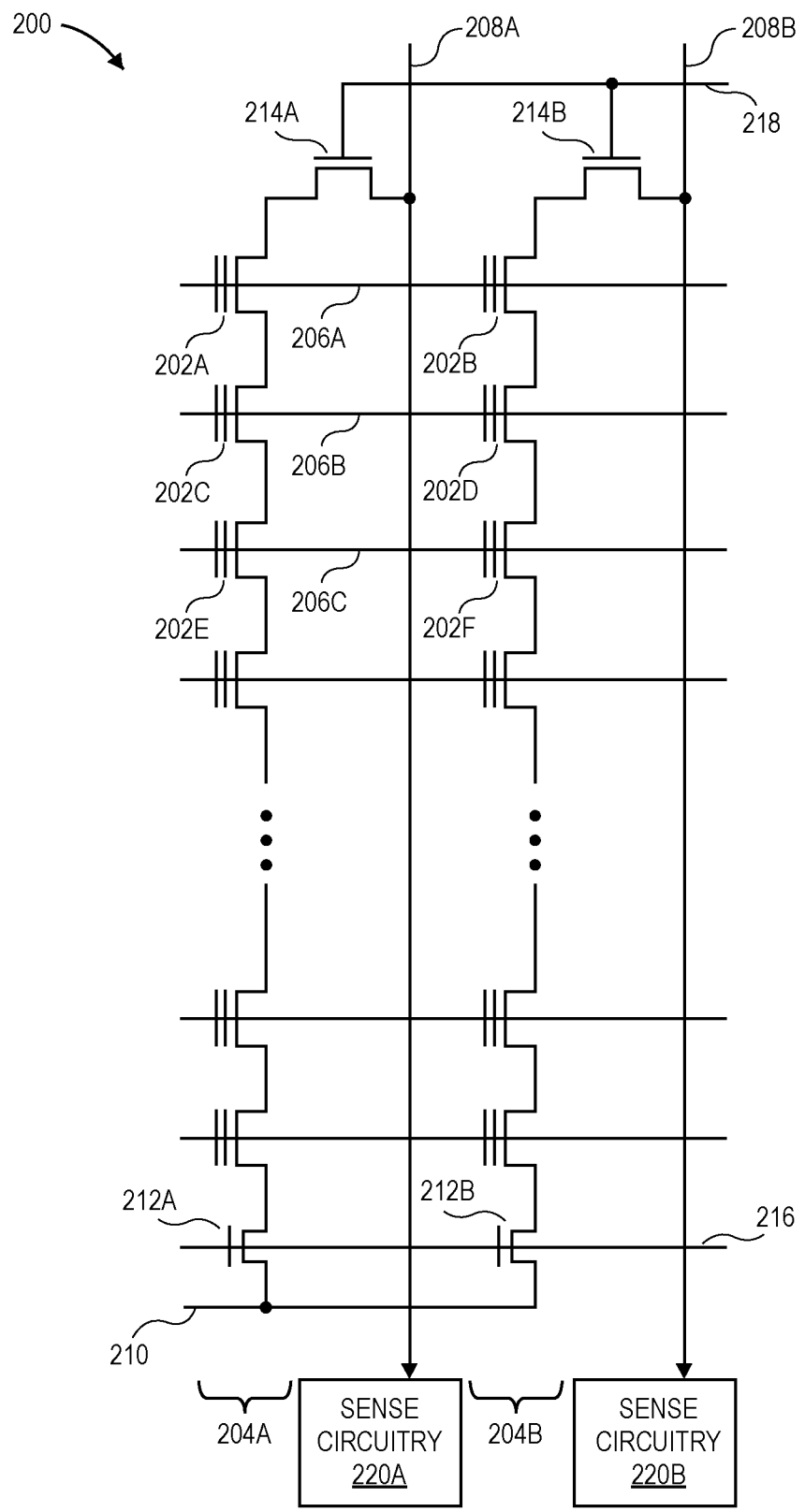
FIG. 2 depicts an example portion of a NAND flash memory array for which read disturb mitigation techniques can be implemented.

FIG. 2 depicts an example portion of a NAND flash memory array 200 for which read disturb mitigation techniques can be implemented. The NAND flash memory array 200 includes multiple non-volatile memory cells 202A-202F (abbreviated as 202) arranged in columns, such as series strings 204A and 204B (abbreviated as 204). In one example, the memory cell 202 includes a transistor with a replacement gate. A cell with a replacement gate typically has a low resistance gate (e.g., a tungsten gate) and a charge trap layer between the gate and the channel where charge is trapped or stored to represent one or more bit values. In another example, a memory cell 202 can include a transistor with a floating gate (e.g., a high resistance poly gate) that stores charge indicative of one or more bit values. Other architectures are also possible. In the series strings 204, drain regions of cells 202 are (with the exception of the top cell) coupled to a source region of another cell 202.

The array 200 also includes wordlines 206A-206C. The wordlines 206A-206C can span across multiple series strings 204 (e.g., a wordline may be coupled to one memory cell of each series string 204) and are connected to the control gates of each memory cell 202 of a row of the array 200 and used to bias the control gates of the memory cells 202 in the row. The bitlines 208A and 208B (abbreviated as 208) are each coupled to a series string 204 by a drain select gate 214 and sensing circuitry 220A and 220B that detects the state of each cell by sensing voltage or current on a particular bitline 208.

Multiple series strings 204 of the memory cells are coupled to a source line 210 by a source select gate or select-gate-source (SGS) 212A and 212B (abbreviated as 212) and to an individual bitline 208 by a drain select gate or select-gate-drain (SGD) 214A and 214B (abbreviated as 214). The source select gates 212 are controlled by a source select gate control line 216 and the drain select gates 214 are controlled by a drain select gate control line 218.

In some examples, each memory cell 202 can be programmed according to various encoding schemes such as SLC (single level cell), MLC (multi-level cell) TLC (triple level cell), QLC (quad level cell), or other encoding scheme. Each cell's threshold voltage (Vt) is indicative of the data that is stored in the cell. In one example, a cell state that is set to store multiple bits may form a part of multiple different pages, with each bit of the cell corresponding to a distinct page. For example, for a cell that is to enter a state to store 2 bits (e.g., using an MLC encoding scheme), one bit may correspond to an Upper Page (UP) and the other bit may correspond to a Lower Page (LP). For a cell that is to enter a state to store 3 bits (i.e., using a TLC encoding scheme), one bit may correspond to an LP, one bit may correspond to a UP, and the other bit may correspond to an Extra Page (XP). For a cell that is to store 4 bits (i.e., using a QLC encoding scheme), one bit may correspond to an LP, another bit may correspond to a UP, another bit may correspond to an XP, and the final bit may correspond to a Top Page (TP). Each page (e.g., LP, UP, XP, or TP) may include an aggregation of corresponding bits stored by a plurality of different cells of a wordline.

In the case of a read, particular voltages are applied to the wordlines 206A-206C as well as select gates. The respective charges stored in the cells that are coupled to the activated word line influence the potential on their respective columns (e.g., "channels") and bit lines which are then sensed with sense circuitry (e.g., the sense circuitry 220A or 220B) to determine the read information (the cells that are not coupled to the activated word line are electrically isolated from their respective columns). Typically, a nominal voltage is applied to the source line during the read operation. In contrast, techniques are described herein that involve driving up the source voltage in sections of the read waveform that are not critical for sensing (e.g., reading the data from the selected sub-block).

Figure 3:
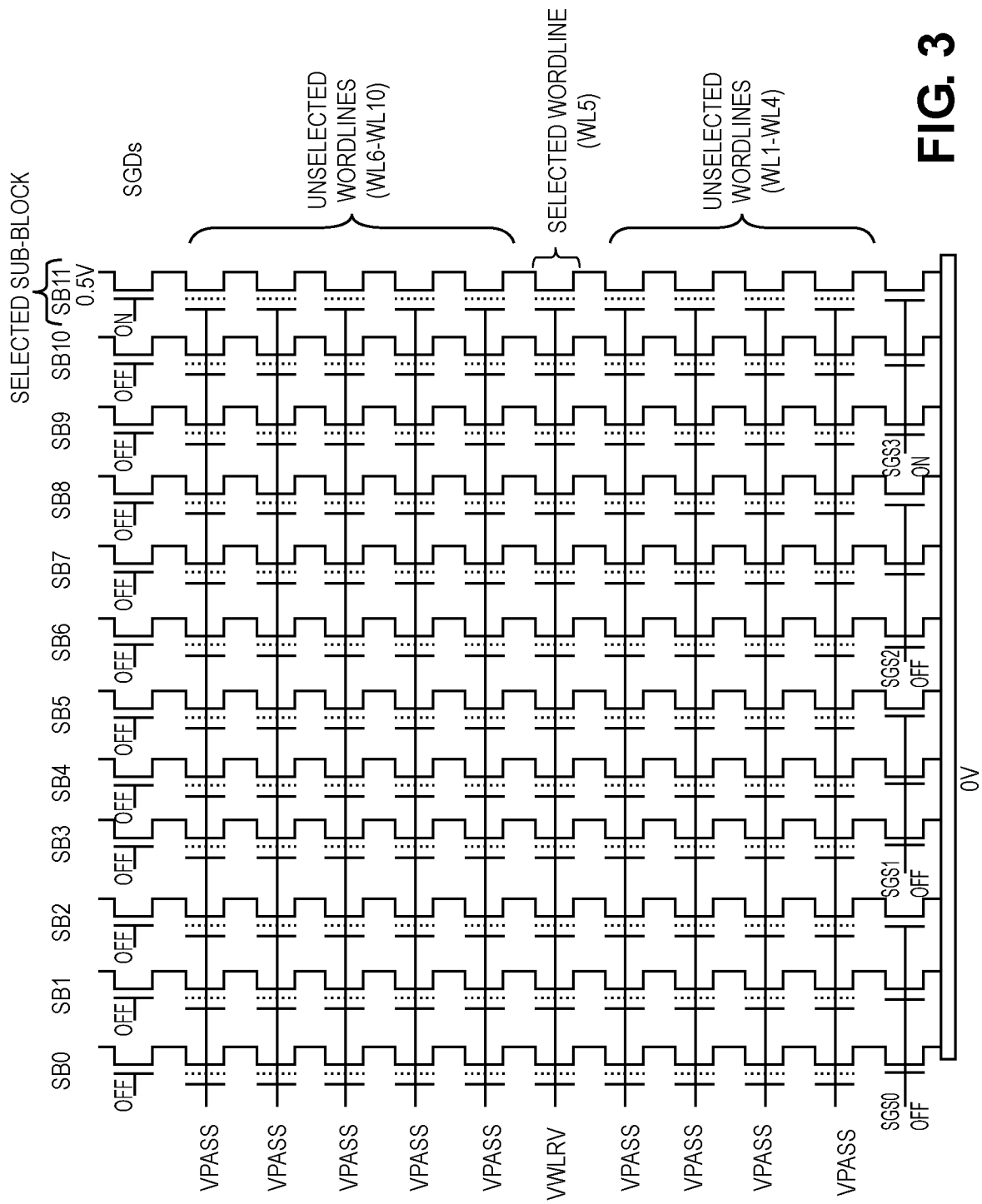
FIG. 3 illustrates an example of a portion of a NAND array in a read scenario.

FIG. 3 illustrates an example of a portion of a NAND array in a read scenario. In the example illustrated in FIG. 3, there are twelve sub-blocks (SB0-SB11), ten word lines (WL1-WL10), and four SGS groups (SGS0, SGS1, SGS2, and SGS3). In the illustrated example, wordline 5 (WL5), sub-block 11 (SB11) on SGS3 is being read. In order to read a particular wordline and sub-block, typically all the wordlines and select gates are ramped up partially to overdrive the wordlines and select gates. The unselected SGS and SGD on unselected SGS are then turned off, floating the pillars for the unselected SGS. The selected wordline (WL5) is then ramped down towards the target read voltage (VWLRV) and the unselected wordlines (WL0-WL4 and WL6-WL9) finish the ramp to the target VPASS voltage, which causes the unselected pillars to be boosted. In one example, the VPASS voltage is a high voltage that is greater than VTmax (the maximum expected threshold voltage). The SGDs on the unselected sub-blocks of the selected SGS are turned off to prevent them from supplying current during the read operation. The target pillars can then be sensed.

Figure 4A:
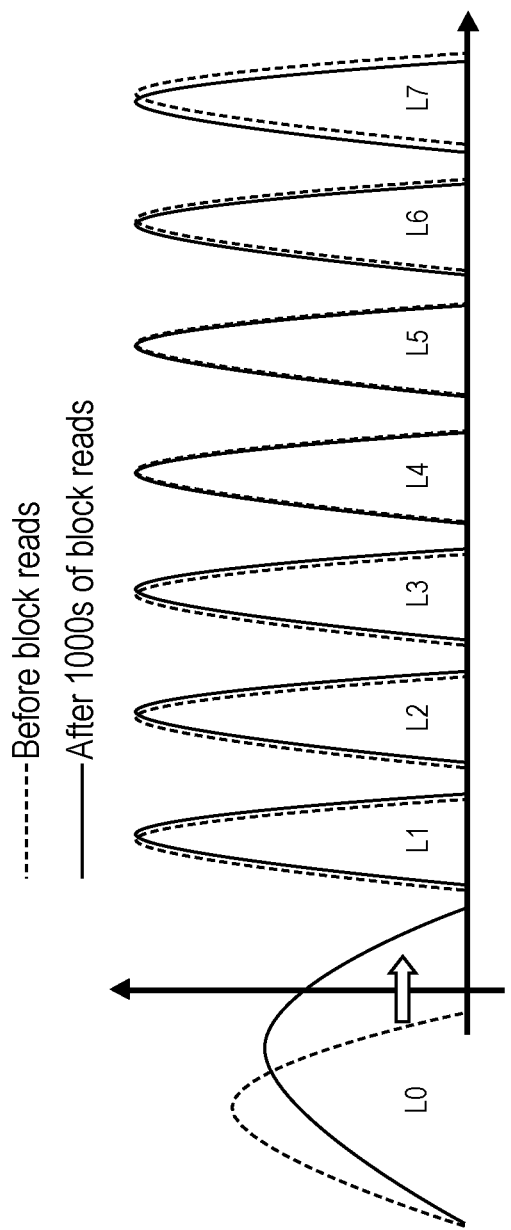
FIG. 4A illustrates an example of threshold voltage distributions before and after FN disturb.

Thus, as part of the read operation, the access circuitry typically overdrives the unselected wordlines to a high enough bias to fully turn them on and allow the bitline/source bias to pass unhindered to the target cell. The act of overdriving the unselected wordlines can create a weak field across the tunnel oxide on all the unselected WLs, which can be sufficient to cause a weak-programming via Fowler Nordheim tunneling. The accumulation of thousands of such reads over the entire array (e.g., block) may result in significant read disturb. For example, FIG. 4A illustrates an example of threshold voltage distributions before and after FN disturb. FIG. 4A illustrates threshold voltage distributions for levels L0-L7 for a triple-level cell (TLC) NAND array that stores three bits per cell. The dotted lines show the distributions before block reads, and the solid lines show the distributions after thousands of block reads. As can be seen in FIG. 4A, level 0 (L0) experiences the most significant shift in threshold voltage distribution.

Figure 4B:
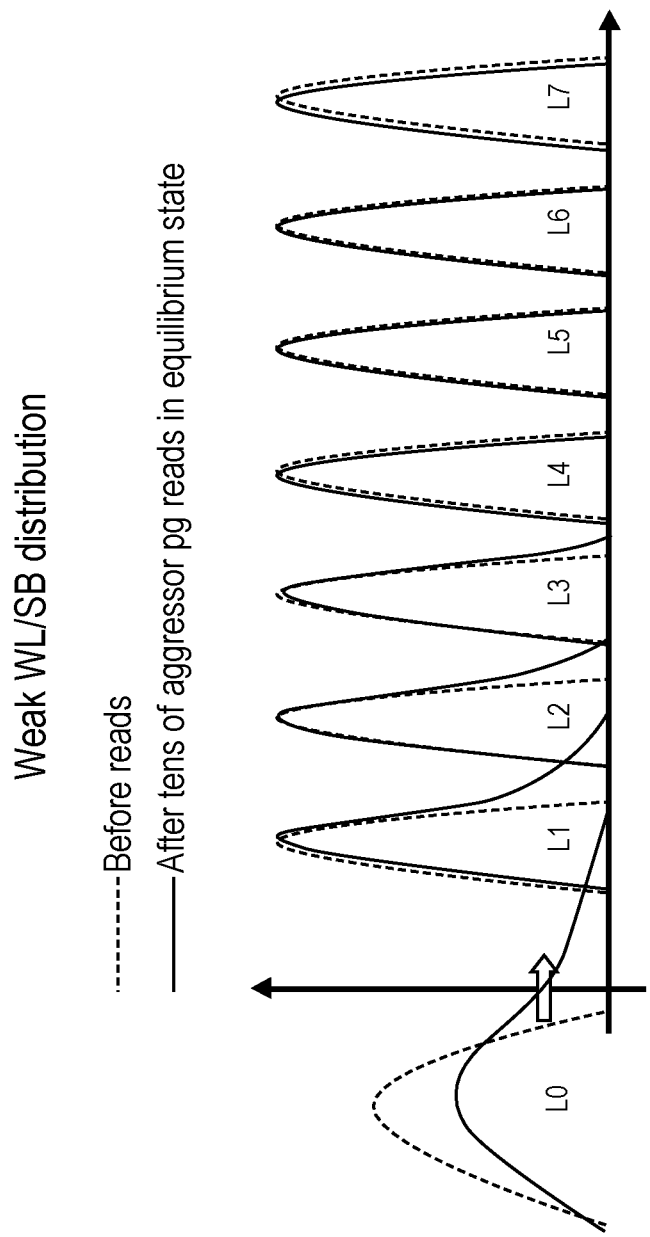
FIG. 4B illustrates an example of threshold voltage distributions before and after HCI disturb.

As mentioned above, hot-carrier injection (HCI) is another type of read disturb. In the case of an array that has equilibrated by staying idle for a long time, the array may lose all the negative pillar potential (e.g., electrons) from the prior reads. Therefore, when an aggressor read is performed, the wordline driver sees more load because all these electrons need to be supplied again. This can slow down the wordline ramp considerably as cells begin to invert serially from either ends of the pillar, especially in the case of larger and larger strings in subsequent generations of 3D NAND. For example, FIG. 4B illustrates an example of threshold voltage distributions before and after HCI disturb. FIG. 4B illustrates threshold distributions for levels L0-L7 for a TLC NAND array. The dotted lines show the distributions before block reads, and the solid lines show the distributions after tens of aggressor page reads in an equilibrium state (after an idle period). As can be seen in FIG. 4B, level 0 (L0), Level 1 (L1), Level 2 (L2), and Level 3 (L3) all experience a significant shift in threshold voltage distribution. Referring to FIG. 3, consider an example where the wordlines ramp up after an idle period. The channel in the sub-blocks of an unselected SGS in the near neighborhood of a target middle WL (e.g., WL5), which is far away from the pillar ends that supply the electrons, may experience significant boost. By giving some stabilization time before bringing down the selected wordline to the target read voltage, some of the boost in the neighborhood can potentially dissipate, but not low enough to avoid HCI read disturb. Now, when the selected wordline ramps down to the target read voltage, a high channel potential gradient is created between the selected wordline and the unselected neighbors on the unselected pillars (e.g., SGD0-SGD8), which results in hot carrier electron injection into the neighbor wordline floating gates. This HCI disturb not only disturbs L0, but also the lower placed levels, thereby substantially increasing the risk of irrecoverable data corruption.

As mentioned above, conventional techniques for addressing read disturb are complex and can require prohibitively high engineering resources to design and implement. By delaying the SGS/SGD shut-off, the boost in the sub-blocks of the unselected SGSs can be reduced. While this allows more electrons to be supplied from SRC/BL to dissipate the pillar boost and reduce the lateral field that causes HCI injection near the target WL, it also reduces the average boost in the pillar. Therein lies a trade-off between high boost helping reduce FN disturb but worsening HCI disturb and vice-versa. A significant engineering effort is needed to optimize the boost for each read waveform type, considering this trade-off. In contrast, techniques that involve driving up the source voltage during the read operation when the array is idle (e.g., not during sensing), read disturb improvements can be achieved without the complexity of conventional techniques. Additionally, while conventional techniques only improve read disturb on the unselected SGS, not on the selected SGS, driving up the source voltage between sensing operations can result in read disturb improvement on the selected SGS also.

FIGS. 5A-5D illustrate examples of read waveforms. The voltages shown in the read waveforms may be generated or applied by access circuitry on the NAND die (e.g., the access circuitry 135 of the NAND die 130 of FIG. 1), by circuity coupled with the NAND die, or a combination of circuitry that is on-die and separate from the NAND die.

FIGS. 5A and 5B illustrate examples of read waveforms for NAND dies that do not have a high voltage external power supply to drive the wordlines ("non-VPP mode"). For the NAND devices operating in non-VPP mode, the high voltages for driving the wordlines are generated internally (e.g., with charge pumps having limited efficiency). Therefore, it can take more time to ramp up voltages (e.g., voltages applied to the wordlines) compared to a NAND device provided with an external high voltage power source (operating in VPP mode). In one example, power supply voltages may range from −0.6V to 16V; however, other supply voltages are possible.

Turning first to FIG. 5A, FIG. 5A illustrates a technique to mitigate read disturb in the unselected SGS for a device without a high voltage external power source. For the purpose of this illustration, the voltage levels prior to time t0 are "don't care" (e.g., the voltage levels prior to time t0 are shown as 0V; however, they may be at non-zero voltages).

At time t0, the wordlines begin to ramp up from an initial voltage to a target voltage (VPASS). As shown in the example in FIG. 5A, the voltage level 501 of both selected and unselected wordlines increases from the initial voltage starting at time t0. As mentioned above, because the device uses charge pumps to drive the wordlines to high biases, the wordline ramp is slower than if an external power supply were available to drive the wordlines. In the illustrated example, the voltage 508 applied to the source line is also increased to a nominal voltage Vsrc at time t0. In one example, the nominal source voltage in a range of 0.4V to 1.1V; however, other nominal source voltages are possible. The source line is held at the same voltage level Vsrc for the duration of the read operation (e.g., before, during, and after sensing). Also in the example illustrated in FIG. 5A, the voltage 504 applied to the selected SGD and selected SGS ramps up to a predetermined voltage.

In this example, while the wordlines are ramping up to VPASS, the voltage level applied to the wordlines is monitored to determine when a predetermined intermediate voltage is reached. For example, an analog voltage detection circuit of the VPASS regulator is used to determine an intermediate point (referred to as "Hit-SGS") in the voltage ramp. The predetermined intermediate voltage Hit-SGS is between the initial voltage (for example, 0V or a different low initial voltage) and VPASS. In one example, the intermediate voltage is hundreds of mV lower than VPASS.

At time t1, the wordlines have reached the intermediate voltage Hit-SGS. Once the voltage detection circuit detects that the wordlines have reached the intermediate voltage level, the sub-blocks in the unselected SGS can be isolated. For example, the unselected select gates (e.g., unselected SGSs and SGDs on unselected SGSs) can be turned off by driving down the voltage level of the unselected gates (e.g., to 0V or another lower magnitude voltage level). By turning off the unselected SGSs and SGDs on unselected SGSs when before the wordlines reach the target voltage VPASS, the remaining voltage in the wordline ramp (VPASS-Hit-SGS) gets transferred to the channel as a boost, thereby reducing the WL-channel potential difference. In one example, the boost on the unselected sub-blocks (e.g., SGDs on the unselected SGSs) is equal to the difference between Vpass and the Hit-SGS detection voltage (shown as uSGS boost in FIG. 5A). After time t1, the voltage 506 of the selected wordlines decreases to the read voltage (VWLRV) and the voltage 502 of the unselected wordlines continues to ramp up to VPASS.

At time t2, the unselected wordlines have reached the voltage VPASS. A detection circuit may be used to detect when the unselected wordlines have reached the voltage VPASS. In response to the unselected wordlines reaching VPASS (Hit-Vpass trigger), the SGD on the selected SGS can be turned off. For example, the voltage 510 applied to the SGDs on unselected sub-blocks on the selected SGS decreases (e.g., to 0V or another low voltage level).

Thus, by floating the pillars that need not be on during a given read, the amount of disturb seen on the unselected wordlines can be reduced. By using this way, the channel on these pillars couples fully to the wordline bias that is ramping up and reduces the wordline-to-channel (and floating gate-to-channel) electric field, directly reducing the FN disturb. Referring to the example in FIG. 3, sub-blocks SB0-SB8 can be floated during the ramp. The precise timing at which the pillars are floated determines the amount of boost achieved on the unselected pillars and can be optimized to minimize the FN disturb.

Thus, the technique of FIG. 5A can result in a reduction in the FN disturb by partially boosting the SBs on the unselected-Select-Gate-Source. However, the hit-SGS detect technique may have disadvantages as the wordline ramp is improved with successive generations of NAND technology, in order to improve read latency. The faster the wordline ramp, the more difficult it may be to detect when the wordline has reached a predetermined intermediate voltage. Therefore, it may be harder to control for both FN and HCI disturb. Furthermore, wordline ramp-rates can vary significantly between different types of read (for example, single plane reads, multi-plane reads, special fast reads, IMPRO (independent multi-plane read operation), or other NAND read types) due to the loading on the driving-regulator. These loading differences may also translate to differences in the transient voltages at the regulator versus the local wordline. Therefore, the technique of FIG. 5A involves significant design complexity. For example, in the technique of FIG. 5A, every read waveform for the different read types may need a separate optimization to achieve a boost on the unselected SGS. Additionally, the technique described in FIG. 5A may improve FN disturb on the unselected SGS but does not reduce the FN disturb on the sub-blocks in the selected SGS.

In contrast, the technique illustrated in FIG. 5B can enable reduction in read disturb in both unselected and selected SGS, while also reducing the complexity of the uSGS read disturb mitigation. Like the technique in FIG. 5A, the example in FIG. 5B illustrates a technique to mitigate read disturb for a device with a relatively slower wordline ramp rate (e.g., a NAND device without a high voltage external power source). For the purpose of this illustration, the voltage levels prior to time t0 are "don't care" (e.g., the voltage levels prior to time t0 are shown as 0V; however, they may be at non-zero voltages).

The example in FIG. 5B illustrates increasing the source line voltage at two different times during the read operation (labeled section A and section B in the read waveform). The source line voltage is increased during the wordline ramp to the target voltage Vpass (section A) and during the selected wordline-ramp to the target voltage (section B). Referring to section A, the wordlines ramp to Vpass while the source is driven higher than the nominal voltage used during sensing. In the example of FIG. 5B, the trigger for the isolation of the sub-blocks in the uSGS is based on Vpass-detection. The boost on the uSGS sub-blocks is determined by the difference between the higher source voltage in the ramp and the nominal source voltage used during sensing. Referring to section B, the source is driven higher than the nominal voltage used at sense during the Selected-WL-ramp to the target read voltage (VWLRV). The source is brought back down to the nominal voltage during the bitline-stabilization, to allow for the cell current to stabilize before sensing. Waveform section A can achieve a uSGS boosting that is matched across all read types, minimizing the engineering effort during technology development. Waveform section B helps reduce FN disturb in the sSGS sub-blocks in some sections of the read waveform, improving the number of reads capability of the device.

Turning to FIG. 5B, at time t0, the wordlines 521 begin ramping up to a target voltage VPASS. In the illustrated example, both the selected wordline and unselected wordline voltages are ramped up to the target voltage Vpass. Also at time t0, the selected SGD and selected SGS 524 begin ramping up to a predetermined voltage. The wordline ramp up period (referred to in FIG. 5B as "section A") begins at time t0 and ends when the wordlines reach the target voltage Vpass at time t1. During the wordline ramp-up, the source voltage is increased to a predetermined source voltage Vsrc1. In one example, the source line is held at the higher source voltage Vsrc1 at least until the wordlines have ramped up to the target voltage VPASS. The source voltage may then be decreased to a lower voltage Vsrc2 for sensing. Thus, unlike in FIG. 5A, where the same nominal source voltage Vsrc2 is applied to the source line for the duration of the read operation (when the array is idle and not idle), the source voltage in FIG. 5B is increased during the wordline ramp-up. The magnitude of the source voltage Vsrc1 is higher than the magnitude of the nominal source voltage that is applied to the source line in typical read waveforms, such as Vsrc in FIG. 5A. The magnitude of the source voltage Vsrc1 is greater than the magnitude of the source voltage Vsrc2 that is applied to the source line when the array is not idle (e.g., during sensing). In one example, the maximum magnitude of Vsrc1 is the magnitude of Vsrc2+(VPASS−Vtmax), where Vpass is the target voltage to which the wordlines are ramped up to prior to sensing and VTmax is the maximum threshold voltage of the NAND memory cells (considered with 0V source reference).

In one example, the voltage applied to the source line is based on whether the array is idle. Whether or not the array is idle may be determined based on one or more triggers, such as a change in one or more signal values, a sequence of events, a time delay, and/or other triggers. FIG. 5B illustrates an "Array_idle" signal 523 for illustrative purposes to show when the array is idle (e.g., when a sensing operation is not being performed) and when the array is not idle (when a sensing operation is being performed). In FIG. 5B, the Array_idle signal is "high" when the array is idle and "low" when the array is not idle; however, other conventions may be used (e.g., the Array_idle signal may be low to indicate idle and high to indicate not idle). Furthermore, although a single signal (Array_idle) is shown in FIG. 5B as representing that the array is idle or not idle, one or more signals, a sequence of events, time delays, and/or some other trigger may be used to determine whether the array is idle, whether actual sensing is occurring, and whether the source voltage should be increased in Vsrc1 or decreased to Vsrc2. Regardless of which trigger(s) cause the source voltage to be increased to Vsrc1, the source voltage is held at Vsrc1 for at least part of the time the array is idle and decreased to Vsrc2 for the sensing portion of a sensing operation.

Regardless of the approach to determine whether the array is idle, in one example, the source voltage applied to the source line is increased when the array is idle and decreased when the array is not idle. Thus, in one example, the voltage applied to the source line is increased to Vsrc1 in response to signals indicating that the array is idle, and the voltage applied to the source line is decreased to Vsrc2 in response to one or more signals indicating the array is not idle. In another example, the voltage applied to the source line is increased when the array is idle and decreased before the array is not idle (e.g., after the wordline ramp-up completes but prior to one or more signals indicating the array is not idle). Thus, in one such example, the voltage applied to the source line is increased to Vsrc1 in response to the Array_idle signal indicating the array is idle and/or the beginning of the wordline ramp-up and decreased in response to the wordlines reaching the target voltage VPASS. In another example, the source voltage is held at Vsrc1 past the time that one or more signals indicate the array is no longer idle. For example, the source voltage may be held at Vsrc1 during an initial part of a sensing operation or a final part of a sensing operation (e.g., while the bitlines are charged up, while the bitlines settle, and after the sense amplifier has sensed the voltage at the sensing node) and decreased to Vsrc2 for the sensing portion of a sense operation (e.g., while the current is charging or discharging the sensing node and while the sense amplifier senses current at the sensing node).

In the example illustrated in FIG. 5B, the voltage applied to the source is increased or ramped up to Vsrc1 at about time t0, concurrently with the beginning of the wordline ramp. The ramp-up of the source voltage to Vsrc1 may begin at approximately the same time as the ramp-up of the wordline voltages and selected SGD & SGS voltages or may begin slightly before or after the beginning of the wordline ramp-up. Similarly, the ramp up of the source voltage may begin slightly before or after the beginning of the selected SGD/SGS ramp-up.

At time t1, the wordlines have ramped up to the target voltage VPASS (Hit-Vpass trigger). In the example illustrated in FIG. 5B, the voltage 522 of the unselected wordlines is held at VPASS. In response to detection that the wordline voltages reached the target voltage VPASS, the selected wordline voltage 526 is ramped down from VPASS to a second target voltage VWLRV (the wordline Read and Verify voltage). In the illustrated example, VWLRV is the voltage applied to the selected wordline during sensing. Also in response to the wordlines reaching the target voltage VPASS, the unselected select gates are turned off. In one example, the unselected SGSs, SGDs on unselected SGSs, and SGDs on unselected sub-blocks on a selected SGS are all turned off (e.g., isolated) in response to detection that the wordline voltages reached the target voltage VPASS. In the example illustrated in FIG. 5B, the voltages 530 at the unselected gates decrease to zero.

The time between the wordlines reaching the target voltage VPASS at time t1, and the delay for the selected wordline to reach the target read voltage at time t2 is referred to in FIG. 5B as "section B." In the example illustrated in FIG. 5B, the voltage applied to the source line is held at Vsrc1 in section B while the selected wordline is ramped to the target read voltage.

At time t2, the voltage applied to the source line is decreased to the lower source voltage Vsrc2 after the selected wordline voltage is ramped down to the second target voltage VWLRV. In the illustrated example, the application of Vsrc2 to the source line is also after a predetermined delay (WL_WAIT) after the ramp down of the selected wordline to the second target voltage. In one example, application of Vsrc2 to the source line is in response to the Array_idle signal 523 indicating the storage array is not idle and/or after waiting for the pre-determined delay WL_WAIT. Thus, the source is brought back down to the nominal voltage Vsrc2 during the bitline-stabilization to allow for the cell current to stabilize before sensing.

At time t3, the voltage applied to the source line is increased to Vsrc1 a second time. In one example, the second increase in source voltage at time t3 is in response to the Array_idle signal indicating the array is idle (e.g., that sensing is complete). In the example illustrated in FIG. 5B, the source voltage is at the higher Vsrc1 voltage while the selected wordline voltage ramps to a third target voltage (another read voltage VWLRV2). In the illustrated example, the third target voltage is the selected wordline voltage for the next sensing operation. The time between the end of sensing at time t3 and the delay for the selected wordline to reach the next target read voltage at time t4 is also referred to in FIG. 5B as "section B." After a predetermined time WL_WAIT, the wordline is at the expected target voltage, and the Array_idle signal goes low to indicate the array is not idle. In response to the Array_idle signal indicating the array is not idle and/or after the delay WL_WAIT, the voltage applied to the source voltage decreases at time t4 to the voltage Vsrc2 applied to the source line during sensing.

Thus, unlike the technique illustrated in FIG. 5A, the voltage applied to the source line in FIG. 5B is increased one or more times when sensing is not occurring. The higher source line voltage can be applied during the wordline ramp-up to the target voltage VPASS and/or during the time the selected wordline ramps to and settles at a target read voltage. In one example, the source line voltage is increased when one or more signals or a sequence indicates the array is idle and decreased when one or more signals or a sequence indicates the array is not idle during a read operation. Note that although FIG. 5B shows section B twice, the source voltage may be increased any number of times that the array is idle during the read (e.g., one, three, four, or more times). For example, the source voltage may be increased between sensing operation when the array is idle. Additionally, although the source voltage is shown as being held at Vsrc1 for the duration of Section A and Sections B, the source voltage may be decreased (e.g., to Vsrc2 or another voltage that is less than Vsrc1) and increased one or more times during Sections A and B. For example, referring to FIG. 5B, the source voltage may be decreased from Vsrc1 to a lower voltage and increased again to Vsrc1 one or more times during the wordline ramp and or while the wordlines settle.

FIGS. 5C and 5D illustrate examples of read waveforms for NAND dies for which a high voltage external power supply is available to drive the wordlines ("VPP mode"). When a high voltage external power supply is available, high voltages can be generated internally in the NAND die with minimal use of charge pumps or without charge pumps. The high voltage external power supply enables faster wordline ramp rates compared to NAND devices that do not have access to a high voltage external power supply. Due to the fast wordline ramp rate, the partial boosting technique described with respect to FIG. 5A in which an intermediate voltage is detected during the wordline ramp may be impractical. In contrast, FIG. 5C illustrates an example of a technique to achieve partial boosting for devices with high voltage power supplies and a fast wordline ramp rate. In the VPP mode use case illustrated in FIG. 5C where an external high voltage power supply is available to drive the WLs, the global wordline ramp-rate is very high. The global wordlines are driven to an intermediate Vpass-stall voltage for a pre-determined duration to allow the local wordlines to settle. Subsequently, the sub-blocks in the unselected SGS are isolated and these pillars get boosted by an amount that is the remaining wordline ramp to Vpass.

Turning to the waveform illustrated in FIG. 5C, for the purpose of this illustration, the voltage levels prior to time t0 are "don't care" (e.g., the voltage levels prior to time t0 are shown as 0V; however, they may be at non-zero voltages). At time t0 the wordline voltages 541 (selected and unselected wordline voltages) are ramped up to an intermediate voltage (Vpass-stall) that is lower than the target voltage Vpass. In the example illustrated in FIG. 5C, the voltage 552 applied to the source line increases to a nominal voltage, Vsrc. In the example of FIG. 5C, the nominal voltage Vsrc is the voltage applied to the source line during the entire read operation (before, during, and after sensing). Also at time t0, the selected SGD and selected SGS 544 begin ramping up to a predetermined voltage.

The wordlines are held at the intermediate voltage Vpass-stall for a predetermined time (TIMER1). In the illustrated example, the predetermined time can start at t0 when the wordlines begin to ramp up. After the predetermined time (e.g., after expiration of TIMER1) at time t1, unselected SGSs and SGDs on unselected SGSs are turned off to isolate those pillars. Therefore, in the example illustrated in FIG. 5C, the voltages 552 of the unselected SGSs and SGDs on unselected SGSs ramp down to 0V. The sub-blocks in the unselected SGS are thus isolated and these pillars get a boost by an amount that is the remaining wordline ramp to Vpass (Vpass minus Vpass-stall). Also after time t1, the unselected wordlines 542 continue the ramp up to the target voltage VPass and the selected wordlines ramp down to the target voltage VWLRV for sensing. After a second predetermined time (TIMER2) at time t2, the SGDs on unselected sub-blocks on selected SGS are turned off. Therefore, in the example illustrated in FIG. 5C, the voltages 550 of the SGDs on unselected sub-blocks on the selected SGS ramp down to 0V. Thus, after two timers (TIMER1+TIMER2), the SGDs on all the unselected sub-blocks ramp down to 0V. The source voltage is held constant at the nominal voltage Vsrc.

At time t3, sensing is complete and the voltage 546 applied to the selected wordline increases. The source voltage 548 stays low during the wordline ramp, during sensing, and after sensing is complete.

The waveform of FIG. 5D is similar to the waveform of FIG. 5C in that FIG. 5D illustrates a technique to mitigate read disturb for a device with fast wordline ramp (e.g., due to a high voltage power supply). However, unlike FIG. 5C, the source voltage is increased to a higher magnitude voltage when the array is idle. Also, the technique in FIG. 5D involves ramping up the wordlines directly to the target voltage VPASS, rather than ramping the wordlines up to an intermediate voltage with a lower magnitude than VPASS. Additionally, instead of SGDs being turned off after two different timers in FIG. 5C, the technique illustrated in FIG. 5D involves turning off the unselected SGSs, SGDs on unselected SGSs, and SGDs on unselected sub-blocks on the selected SGS at the same time after a single timer. Thus, the technique in FIG. 5D uses a single timer to turn off SGDs instead of two timers, reducing complexity. Also in the example illustrated in FIG. 5D, the source voltage is increased a second time after sensing. Increasing the source voltage reduces the field seen by the array during the read, reducing read stress and reducing read disturb.

Turning to FIG. 5D, at time t0 the wordlines (both selected and unselected wordlines) ramp up to a target voltage Vpass. Also at time t0, the voltage 564 applied to the selected SGD and SGS 564 ramps up to a target voltage. The source voltage 568 also increases from an initial voltage (e.g., 0V or a low magnitude voltage) to a first source voltage Vsrc1. At time t0, the Array_idle signal 563 indicates that the array is idle. As mentioned above with respect to FIG. 5B, the "Array_idle" signal 563 is used for illustrative purposes to show when the array is idle. Whether or not the array is idle may be determined based on one or more triggers, such as a change in one or more signal values, a sequence of events, a time delay, and/or other triggers.

In the example illustrated in FIG. 5D, the source voltage increases at the same time t0 as the beginning of the wordline ramp. In one example, the increase in source line voltage is responsive to one or more signals indicating the storage array is idle, responsive to the wordline ramp-up, or both. In one example, the source line is held at the higher voltage Vsrc 1 at least until the expiration of a predetermined time (TIMER1). In one example, TIMER1 has a duration that allows for all the far wordlines to ramp to VPASS.

After the predetermined time (TIMER1) at time t1, the unselected SGSs, SGDs on unselected SGSs, and SGDs on unselected sub-blocks on the selected SGS are all turned off. Therefore, the voltages 570 applied to the unselected SGSs, SGDs on unselected SGSs, and SGDs on unselected sub-blocks on the selected SGS all begin to ramp down to 0V at the same time t1. Also after time t1, the selected wordline voltage 566 decreases to the target voltage VWLRV for sensing. The voltage on the unselected wordlines 562 stays at VPASS. The time between the ramp-up of the wordlines at time t0 and the expiration of the timer TIMER1 at time t1 is labeled "Section A" in FIG. 5D.

After a predetermined delay (WL_WAIT) at time t2, the Array_idle signal indicates the array is no longer idle (e.g., sensing is beginning). In response to one or more signals indicating the array is no longer idle, the source voltage is decreased to a second source voltage Vsrc2. In one example, Vsrc2 is the source voltage applied to the source line during sensing. The source voltages Vsrc1 and Vsrc2 of FIG. 5D may be the same as the source voltages Vsrc1 and Vsrc2 described above with respect to FIG. 5B. In another example, the source voltage is held at Vsrc1 past the time that one or more signals indicate the array is no longer idle. For example, the source voltage may be held at Vsrc1 during an initial part of a sensing operation or a final part of a sensing operation (e.g., while the bitlines are charged up, while the bitlines settle, and after the sense amplifier has sensed the voltage at the sensing node) and decreased to Vsrc2 for the sensing portion of a sense operation (e.g., while the current is charging or discharging the sensing node and while the sense amplifier senses current at the sensing node).

At time t3, the Array_idle signal indicates the array is idle (e.g., sensing is complete). In response to one or more signals indicating the array is idle, the source voltage is increased a second time to Vsrc1. After a pre-determined delay (WL_WAIT) at time t4, the Array_idle signal indicates the array is no longer idle (e.g., sensing is beginning). The time between the end of sensing at time t3 and the delay for the selected wordline to reach the next target read voltage at time t4 is also referred to in FIG. 5D as "section B." After a predetermined time WL_WAIT, the wordline is at the expected target voltage, and the Array_idle signal goes low to indicate the array is not idle. In response to one or more signals indicating the array is not idle and/or after the delay WL_WAIT, the voltage applied to the source voltage decreases at time t4 to the voltage Vsrc2 applied to the source line during sensing.

Thus, unlike the technique illustrated in FIG. 5C, the voltage applied to the source line in FIG. 5D is increased one or more times when sensing is not occurring. The higher source line voltage can be applied during the wordline ramp-up to the target voltage VPASS, during the time TIMER1 between wordline ramp-up and the selected wordline ramp to the target read voltage, and/or during the time the selected wordline ramps to and settles at a target read voltage. In one example, the source line voltage is increased when one or more signals, a sequence, and/or other triggers indicates the array is idle, and decreased when one or more signals, a sequence, and/or other triggers indicate the array is not idle during a read operation.

Note that although FIG. 5B shows section B twice, the source voltage may be increased any number of times that the array is idle during the read (e.g., one, three, four, or more times). For example, the source voltage may be increased between sensing operations when the array is idle. Also note that although FIGS. 5B and 5D illustrate both section A and section B source voltage increases, other examples may increase the source voltage in only section A (during the initial wordline ramp to VPASS) or sections B (during the selected wordline ramp between sense operations). Additionally, although the source voltage is shown as being held at Vsrc1 for the duration of Section A and Sections B, the source voltage may be decreased (e.g., to Vsrc2 or another voltage that is less than Vsrc1) and increased one or more times during Sections A and B. For example, referring to FIG. 5D, the source voltage may be decreased from Vsrc1 to a lower voltage and increased again to Vsrc1 one or more times during the TIMER1 (e.g., a duration that allows for far wordlines to ramp to VPASS) and or while the wordlines settle. Furthermore, although FIG. 5D shows "TIMER1" and "WL_WAIT," the source line modulation techniques described herein may be performed without specific timers or time delays.

Figure 6:
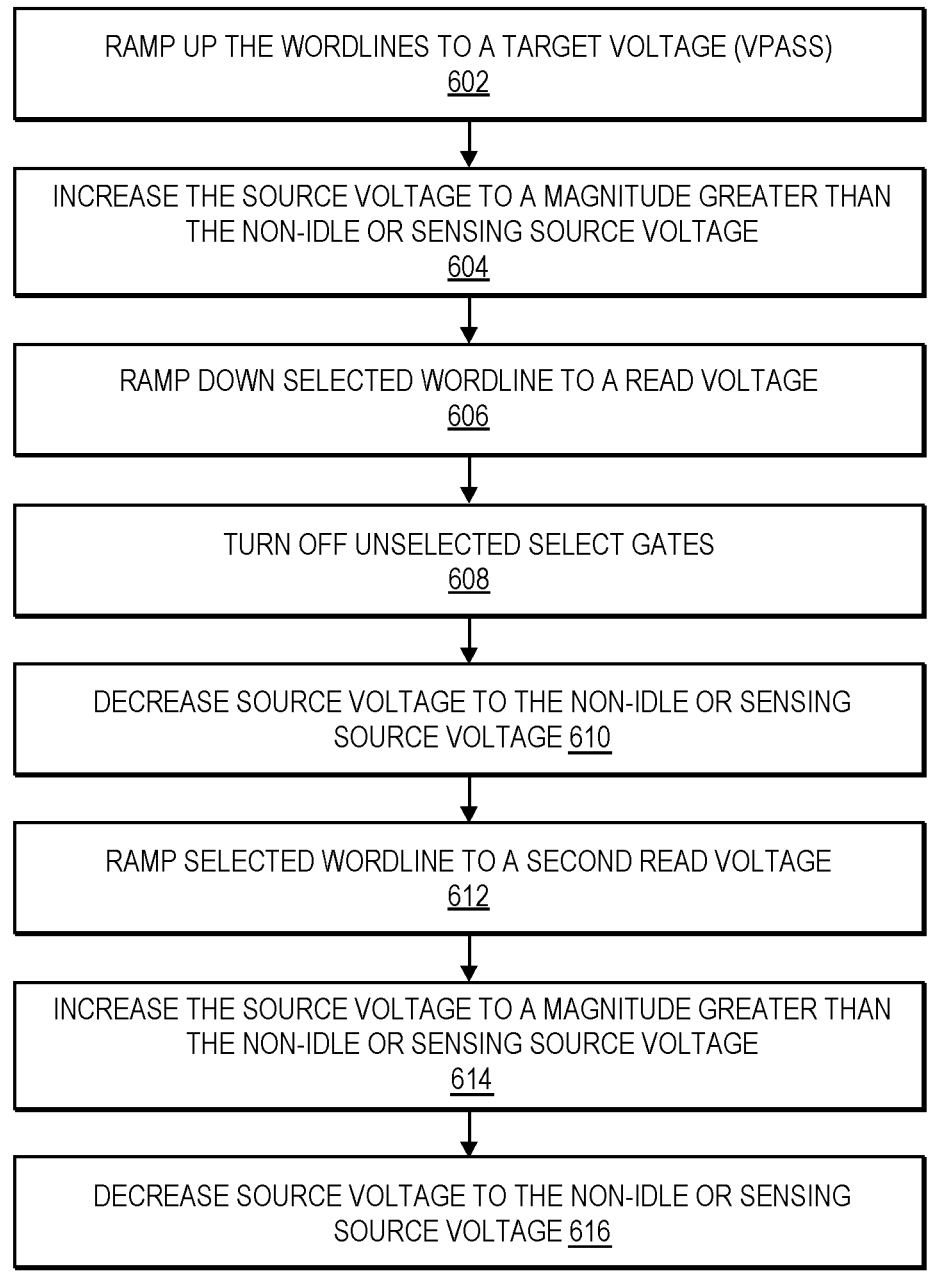
FIG. 6 is a flow diagram of an example of a method of performing a read with read disturb mitigation.

FIG. 6 is a flow diagram of an example of a method of performing a read with read disturb mitigation. In one example, the method 600 is performed by logic of a non-volatile memory device. In one such example, the method 600 is performed by microcode and/or circuitry (e.g., such as access circuitry 135 of FIG. 1) on a 3D NAND die. The method 600 is an example of the techniques illustrated in the waveforms of FIGS. 5B and 5D.

Turning to FIG. 6, the method 600 begins with ramping up the wordlines to a target voltage (e.g., VPASS), at 602. For example, in FIG. 5D, the wordlines quickly ramp up from an initial voltage to VPASS starting at time t0. In FIG. 5B, the wordlines ramp up to VPASS more slowly between times t0 and t1.

The source voltage is increased to a magnitude that is greater than the magnitude of the non-idle source voltage, at 604. For example, in FIGS. 5B and 5D the source voltage is increased from 0V or a nominal voltage to Vsrc1 at time t0.

The selected wordline voltage is ramped down to a read voltage, at 606. For example, referring to FIG. 5D, the selected wordline voltage 566 is ramped down to VWLRV starting at time t1 (after the predetermined time TIMER1). Referring to FIG. 5B, the selected wordline voltage 526 ramps down to VWLRV starting at time t1 in response to the wordlines reaching VPASS (Hit-VPASS trigger).

The unselected select gates 608 are turned off, at 608. For example, referring to FIG. 5D, unselected SGSs, SGDs on unselected SGSs, & SGDs on unselected sub-blocks on selected SGS (see 570) are turned off starting at time t1 (e.g., after the predetermined time TIMER1). Referring to FIG. 5B, unselected SGSs, SGDs on unselected SGSs, & SGDs on unselected sub-blocks on selected SGS (see 530) are turned off in response to the wordlines reaching VPASS.

The source voltage is then decreased to the non-idle source voltage prior to sensing, at 610. For example, referring to FIG. 5D, the voltage applied to the source is decreased from Vsrc1 to Vsrc2 at time t2 in response to the Array_idle signal indicating the array is not idle and/or in response to passage of the delay WL_WAIT. Similarly, in FIG. 5B, the source voltage decreases at time t2 from Vsrc1 to Vsrc2 in response to the Array_idle signal indicating that the array is not idle and/or after the delay WL_WAIT.

The selected wordline is then ramped to a second read voltage, at 612. For example, in FIG. 5D, the selected wordline ramps up to a second target read voltage around time t3. Similarly, in FIG. 5B, the selected wordline begins to ramp up to a second target read voltage around time t3.

The source voltage can be increased again during the selected wordline ramp, at 614. For example, referring to FIG. 5D, the source voltage 568 ramps up to Vsrc1 at around time t3 in response to the Array_idle signal indicating the array is idle. Similarly, the source voltage 528 of FIG. 5B ramps up to Vsrc1 at around time t3 in response to the Array_idle signal indicating the array is idle.

The source voltage is decreased again to the non-idle source voltage prior to sensing, at 616. For example, the source voltage 568 is decreased to Vsrc2 at around time t4 in response to the Array_idle signal indicating the array is not idle. Similarly, the source voltage 528 of FIG. 5B is decreased to Vsrc2 prior to sensing.

Thus, source voltage modulation may be performed in two sections of the read waveform: WL-ramp to VPASS (waveform section A) and selected-WL-ramp to target voltage (waveform section B). In section A, the source is used to actively drive the pillar to a deterministic target boost voltage from the beginning of the WL ramp. Once the pillar has reached the target boost potential, it is isolated. This contrasts with the reference waveform where the SGS/SGD of the unselected SGSs have to be isolated during the WL ramp using a sophisticated dynamic detection of the WL voltage to control the precise timing. The source voltage modulation can achieve the same channel potential as in the reference waveforms described above, assuring identical FN vs. HCI disturb behavior, while eliminating the need for a sophisticated dynamic detection of the wordline ramp.

In section B, the source potential can be increased above the nominal voltage each time the selected wordline is ramping to the target read voltage (e.g., VWLRV). Increasing the source voltage while the selected wordline is ramping to the target read voltage results in a reduction of the overdrive on the sub-blocks in the selected SGS that are resistively coupled to the source, thereby leading to a reduction in FN disturb on the selected SGS. Thus, waveform section A can achieve uSGS boosting that is matched across all read types, with or without a high voltage external power source, minimizing the engineering effort during technology development. Waveform section B can help reduce FN disturb in the sSGS sub-blocks in some sections of the read waveform, improving the number of reads capability of the device.

Figure 7:
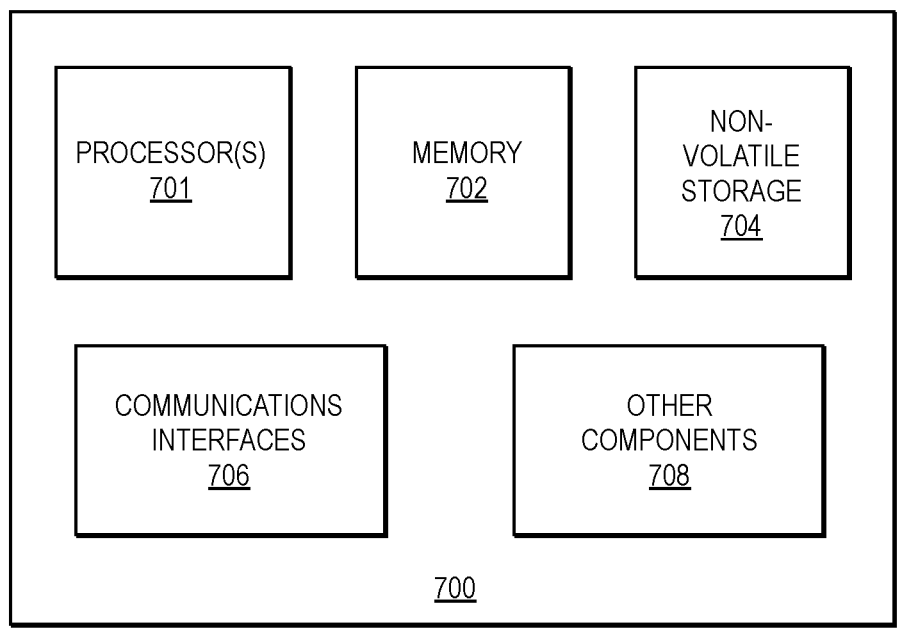
FIG. 7 provides an exemplary depiction of a computing system in which read mitigation techniques can be implemented.

FIG. 7 provides an exemplary depiction of a computing system 700 (e.g., a smartphone, a tablet computer, a laptop computer, a desktop computer, a server computer, etc.). As observed in FIG. 7, the system 700 may include one or more processors or processing units 701. The processor(s) 701 may include one or more central processing units (CPUs), each of which may include, e.g., a plurality of general-purpose processing cores. The processor(s) 701 may also or alternatively include one or more graphics processing units (GPUs) or other processing units. The processor(s) 701 may include memory management logic (e.g., a memory controller) and I/O control logic. The processor(s) 701 can be similar to, or the same as, the processor 152 of FIG. 1.

The system 700 also includes memory 702 (e.g., system memory), non-volatile storage 704, communications interfaces 706, and other components 708, which may also be similar to, or the same as, components of the host 150 of FIG. 1. The other components may include, for example, a display (e.g., touchscreen, flat-panel), a power supply (e.g., a battery or/or other power supply), sensors, power management logic, or other components. The communications interfaces 706 may include logic and/or features to support a communication interface. For these examples, communications interface 706 may include one or more communication interfaces that operate according to various communication protocols or standards to communicate over direct or network communication links or channels. Direct communications may occur via use of communication protocols or standards described in one or more industry standards (including progenies and variants) such as those associated with the PCIe specification. Network communications may occur via use of communication protocols or standards such those described in one or more standards promulgated by IEEE. For example, one such Ethernet standard may include IEEE 802.3. Network communication may also occur according to one or more OpenFlow specifications such as the OpenFlow Switch Specification. Other examples of communications interfaces includes, for example, a local wired point-to-point link (e.g., USB) interface, a wireless local area network (e.g., WiFi) interface, a wireless point-to-point link (e.g., Bluetooth) interface, a Global Positioning System interface, and/or other interfaces.

The computing system also includes non-volatile storage 704, which may be the mass storage component of the system. The non-volatile storage 704 can be similar to, or the same as, the NVM device 120 of FIG. 1, described above. The non-volatile storage 704 can include a solid state drive (SSD), a dual in-line memory module (DIMM), or other non-volatile storage. Non-volatile types of memory may include non-volatile memory such as, but not limited to, multi-threshold level NAND flash memory (e.g., 3D NAND flash memory). In one example, the non-volatile storage 704 may include mass storage that is composed of one or more SSDs. SSDs can be composed of flash memory chips that are capable of implementing the techniques described above.

Examples of NAND Read Techniques Follow

Example 1: A NAND storage device including a storage array including a plurality of strings of NAND memory cells coupled with a source line, and logic to perform a read operation. The logic is to: ramp up wordline voltages of the plurality of strings, apply a first source voltage to the source line with a magnitude greater than a second source voltage applied to the source line during sensing, turn off unselected select gates, and after turning off the unselected select gates, apply the second source voltage to the source line.

Example 2: The NAND storage device of example 1, wherein, the logic to perform the read operation is to: apply the first source voltage to the source line during the ramp up of the wordline voltages and in response to one or more signals indicating the storage array is idle.

Example 3: The NAND storage device of any of examples 1 or 2, wherein: the logic to perform the read operation is to: apply the second source voltage to the source line in response to one or more signals indicating the storage array is not idle.

Example 4: The NAND storage device of any of examples 1-3, wherein the logic to perform the read operation is to: in response to detection that the wordline voltages reached a target voltage VPASS, ramp down a selected wordline voltage from a first target voltage VPASS to a second target voltage, and wherein application of the second source voltage to the source line is after the ramp down of the selected wordline voltage to the second target voltage.

Example 5: The NAND storage device of any of examples 1-4, wherein: the application of the second source voltage to the source line is after a predetermined delay after the ramp down of the selected wordline to the second target voltage.

Example 6: The NAND storage device of any of examples 1-5, wherein the logic to turn off the unselected select gates is to: turn off unselected SGSs (select-gate-source), SGDs (select-gate-drain) on unselected SGSs, and SGDs on unselected sub-blocks on a selected SGS in response to detection that the wordline voltages reached a first target voltage VPASS.

Example 7: The NAND storage device of any of examples 1-6, wherein the logic to perform the read operation is to: apply the first source voltage to the source line after sensing in response to the one or more signals indicating the storage array is idle.

Example 8: The NAND storage device of any of examples 1-7, wherein the logic to perform the read operation is to: apply the second source voltage to the source line in response to the one or more signals indicating the storage array is not idle.

Example 9: The NAND storage device of any of examples 1-8, wherein the logic to turn off the unselected select gates is to: turn off unselected SGSs (select-gate-source), SGDs (select-gate-drain) on unselected SGSs, and SGDs on unselected sub-blocks on a selected SGS after a predetermined time after the ramp up of the wordline voltages.

Example 10: The NAND storage device of any of examples 1-9, wherein the first source voltage has a magnitude that is lower than the magnitude of: the second source voltage plus a first target voltage VPASS to ramp up the wordlines to, minus a maximum threshold voltage of the NAND memory cells with a 0V source reference.

Example 11: A system including a processor, and a NAND storage device coupled with the processor, the NAND storage device including: a storage array including a plurality of strings of NAND memory cells coupled with a source line; and logic to perform a read operation, the logic to: ramp up wordline voltages of the plurality of strings; apply a first source voltage to the source line with a magnitude greater than a second source voltage applied to the source line during sensing; turn off unselected select gates; and after turning off the unselected select gates, apply the second source voltage to the source line.

Example 12: The system of example 11, wherein the NAND storage device is in accordance with any of examples 1-10.

Example 13: The system of example 111 or 12, further including one or more of: a display coupled with the processor, a network interface coupled with the processor, and a battery to power the system.

Example 14: A solid state drive (SSD) including input/output (I/O) interface circuitry to couple with a host, the I/O interface circuitry to receive a read request, and one or more dies including: a NAND storage array, the NAND storage array including a plurality of strings of NAND memory cells coupled with a source line; and logic to perform a read operation in response to the read request, the logic to: ramp up wordline voltages of the plurality of strings; apply a first source voltage to the source line with a magnitude greater than a second source voltage applied to the source line during sensing; turn off unselected select gates; and after turning off the unselected select gates, apply the second source voltage to the source line.

Example 15: The SSD of examples 14, further in accordance with any of examples 1-10.

Embodiments of the invention may include various processes as set forth above. The processes may be embodied in machine-executable instructions. The instructions can be used to cause a general-purpose or special-purpose processor to perform certain processes. Alternatively, these processes may be performed by specific/custom hardware components that contain hardwired logic circuitry or programmable logic circuitry (e.g., FPGA, PLD) for performing the processes, or by any combination of programmed computer components and custom hardware components.

Elements of the present invention may also be provided as a machine-readable medium for storing the machine-executable instructions. The machine-readable medium may include, but is not limited to, floppy diskettes, optical disks, CD-ROMs, and magneto-optical disks, FLASH memory, ROMs, RAMs, EPROMs, EEPROMs, magnetic or optical cards, propagation media or other type of media/machine-readable medium suitable for storing electronic instructions. For example, the present invention may be downloaded as a computer program which may be transferred from a remote computer (e.g., a server) to a requesting computer (e.g., a client) by way of data signals embodied in a carrier wave or other propagation medium via a communication link (e.g., a modem or network connection).

Flow diagrams as illustrated herein provide examples of sequences of various process actions. The flow diagrams can indicate operations to be executed by a software or firmware routine, as well as physical operations. In one example, a flow diagram can illustrate the state of a finite state machine (FSM), which can be implemented in hardware, software, or a combination. Although shown in a particular sequence or order, unless otherwise specified, the order of the actions can be modified. Thus, the illustrated embodiments should be understood only as an example, and the process can be performed in a different order, and some actions can be performed in parallel. Additionally, one or more actions can be omitted in various examples; thus, not all actions are required in every embodiment. Other process flows are possible.

To the extent various operations or functions are described herein, they can be described or defined as software code, instructions, configuration, data, or a combination. The content can be directly executable ("object" or "executable" form), source code, or difference code ("delta" or "patch" code). The software content of the embodiments described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters or sending signals, or both, to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to the disclosed embodiments and implementations of the invention without departing from their scope. Therefore, the illustrations and examples herein should be construed in an illustrative, and not a restrictive sense. The scope of the invention should be measured solely by reference to the claims that follow.

What is claimed is:

1. A NAND storage device comprising:
a storage array including a plurality of strings of NAND memory cells coupled with a source line; and
logic to perform a read operation, the logic to:
ramp up wordline voltages of the plurality of strings;
apply a first source voltage to the source line with a magnitude greater than a second source voltage applied to the source line during sensing;
turn off unselected select gates; and
after turning off the unselected select gates, apply the second source voltage to the source line.

2. The NAND storage device of claim 1, wherein:
the logic to perform the read operation is to:
apply the first source voltage to the source line during the ramp up of the wordline voltages and in response to one or more signals indicating the storage array is idle.

3. The NAND storage device of claim 1, wherein:
the logic to perform the read operation is to:
apply the second source voltage to the source line in response to one or more signals indicating the storage array is not idle.

4. The NAND storage device of claim 3, wherein:
the logic to perform the read operation is to:
in response to detection that the wordline voltages reached a target voltage VPASS, ramp down a selected wordline voltage from a first target voltage VPASS to a second target voltage; and
wherein application of the second source voltage to the source line is after the ramp down of the selected wordline voltage to the second target voltage.

5. The NAND storage device of claim 4, wherein:
the application of the second source voltage to the source line is after a predetermined delay after the ramp down of the selected wordline voltage to the second target voltage.

6. The NAND storage device of claim 1, wherein the logic to turn off the unselected select gates is to:
turn off unselected SGSs (select-gate-source), SGDs (select-gate-drain) on unselected SGSs, and SGDs on unselected sub-blocks on a selected SGS in response to detection that the wordline voltages reached a first target voltage VPASS.

7. The NAND storage device of claim 1, wherein:
the logic to perform the read operation is to:
apply the first source voltage to the source line after sensing in response to one or more signals indicating the storage array is idle.

8. The NAND storage device of claim 7, wherein:
the logic to perform the read operation is to:
apply the second source voltage to the source line in response to the one or more signals indicating the storage array is not idle.

9. The NAND storage device of claim 1, wherein the logic to turn off the unselected select gates is to:
turn off unselected SGSs (select-gate-source), SGDs (select-gate-drain) on the unselected SGSs, and SGDs on unselected sub-blocks on a selected SGS after a predetermined time after the ramp up of the wordline voltages.

10. The NAND storage device of claim 1, wherein:
the first source voltage has the magnitude that is lower than a second magnitude of: the second source voltage plus a first target voltage VPASS to ramp up the wordline voltages to, minus a maximum threshold voltage of the NAND memory cells with a 0V source reference.

11. A system comprising:
a processor; and
a NAND storage device coupled with the processor, the NAND storage device including:

a storage array including a plurality of strings of NAND memory cells coupled with a source line; and
logic to perform a read operation, the logic to:
ramp up wordline voltages of the plurality of strings;
apply a first source voltage to the source line with a magnitude greater than a second source voltage applied to the source line during sensing;
turn off unselected select gates; and
after turning off the unselected select gates, apply the second source voltage to the source line.

12. The system of claim 11, wherein:
the logic to perform the read operation is to:
apply the first source voltage to the source line during the ramp up of the wordline voltages and in response to one or more signals indicating the storage array is idle.

13. The system of claim 11, wherein:
the logic to perform the read operation is to:
apply the second source voltage to the source line in response to one or more signals indicating the storage array is not idle.

14. The system of claim 13, wherein:
the logic to perform the read operation is to:
in response to detection that the wordline voltages reached a target voltage VPASS, ramp down a selected wordline voltage from a first target voltage VPASS to a second target voltage; and
wherein application of the second source voltage to the source line is after the ramp down of the selected wordline voltage to the second target voltage.

15. The system of claim 14, wherein:
the application of the second source voltage to the source line is after a predetermined delay after the ramp down of the selected wordline voltage to the second target voltage.

16. The system of claim 11, wherein the logic to turn off the unselected select gates is to:
turn off unselected SGSs (select-gate-source), SGDs (select-gate-drain) on the unselected SGSs, and SGDs on unselected sub-blocks on a selected SGS in response to detection that the wordline voltages reached a first target voltage VPASS.

17. The system of claim 11, further comprising one or more of:
a display coupled with the processor, a network interface coupled with the processor, and a battery to power the system.

18. A solid state drive (SSD) comprising:
input/output (I/O) interface circuitry to couple with a host, the I/O interface circuitry to receive a read request; and
one or more dies including:
a NAND storage array, the NAND storage array including a plurality of strings of NAND memory cells coupled with a source line; and
logic to perform a read operation in response to the read request, the logic to:
ramp up wordline voltages of the plurality of strings;
apply a first source voltage to the source line with a magnitude greater than a second source voltage applied to the source line during sensing;
turn off unselected select gates; and
after turning off the unselected select gates, apply the second source voltage to the source line.

19. The SSD of claim 18, wherein:
the logic to perform the read operation is to:
apply the first source voltage to the source line during the ramp up of the wordline voltages and in response to one or more signals indicating the NAND storage array is idle.

20. The SSD of claim 18, wherein:
the logic to perform the read operation is to:
apply the second source voltage to the source line in response to one or more signals indicating the NAND storage array is not idle.

* * * * *